United States Patent
Liu et al.

(10) Patent No.: US 6,429,067 B1
(45) Date of Patent: Aug. 6, 2002

(54) DUAL MASK PROCESS FOR SEMICONDUCTOR DEVICES

(75) Inventors: Joyce C. Liu, Hopewell Junction; James C. Brighten, Wappingers Falls; Jeffrey J. Brown, Fishkill; John Golz, Cold Spring; George A. Kaplita; Rebecca Mih, both of Wappingers Falls; Senthil Srinivasan, Fishkill; Jin Jwang Wu, Hopewell junction; Teresa J. Wu, Poughkeepsie; Chienfan Yu, Highland MIlls, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/765,036

(22) Filed: Jan. 17, 2001

(51) Int. Cl.$^7$ .......................................... H01L 21/8242
(52) U.S. Cl. ....................................... 438/241; 438/275
(58) Field of Search ............................... 438/210, 241, 438/253, 275, 283, 396

(56) References Cited

U.S. PATENT DOCUMENTS

| | | | |
|---|---|---|---|
| 6,037,222 A | 3/2000 | Huang et al. | 438/275 |
| 6,287,907 B1 * | 9/2001 | Ito et al. | 438/241 |
| 6,291,279 B1 * | 9/2001 | Hsiao et al. | 438/210 |

* cited by examiner

Primary Examiner—Chandra Chaudhari
(74) Attorney, Agent, or Firm—Ira Blecker; Cantor Colburn LLP

(57) ABSTRACT

A method for fabricating a dual gate structure, comprising providing a semiconductor substrate having a first device area and a second device area covered by a gate oxide layer and a polysilicon layer, forming a first hard mask over the polysilicon layer, said first hard mask being a material that is resistant to a first etching, but susceptible to a second etching forming a second hard mask over the first hard mask and the polysilicon layer, said second hard mask being a material that is resistant to a second etching, but susceptible to a first etching, patterning and etching said second hard mask with a first etch to form a gate pattern on a first device area, and patterning and etching said first hard mask with a second etch to transfer gate patterns on the first and second device areas.

10 Claims, 3 Drawing Sheets

DUAL MASK PROCESS FOR SEMICONDUCTOR DEVICES

FIELD OF THE INVENTION

This invention relates to the manufacture of integrated circuit devices on a semiconductor substrate. In particular, the present invention relates to a fabrication process for making a logic device with embedded memory where the memory and logic FETs require only one additional DUV mask to create separate hard masks for the gate in DRAM arrays, DRAM support, and logic devices.

BACKGROUND OF THE INVENTION

With the advent of Large Scale Integration (LSI), many integrated circuit designs include several circuit functions on a single semiconductor substrate. Modem semiconductor devices usually require different circuit functions on a single chip, such as memory storage and logic functions for addressing and accessing the memory. The semiconductor industry continually is striving to enhance device performance, while still maintaining, or preferably reducing, manufacturing costs of these devices. An approach taken by the industry to accomplish both reduced cost and increased performance has been the integration of logic devices and memory devices on the same semiconductor substrate. Logic circuit and a DRAM cell region formed on the same substrate define an embedded DRAM. The integration of memory and logic improves performance by decreasing communication delays between memory devices on one chip and logic devices located on a second chip. In addition, processing costs for integrating memory and logic devices on the same semiconductor substrate potentially could be reduced due to the sharing of specific processing steps used to fabricate both types of devices.

SUMMARY OF THE INVENTION

The fabrication of embedded DRAM in planar MOSFET cells has involved employing a bordered contact etch process for the DRAM array area of the substrate. This can be attributed to the lack of a cap nitride layer for the a borderless contact etch procedure. Accordingly, reduction in cell size in the array area of e-DRAM has been precluded from approaching the cell size of stand alone DRAM with comparable minimum ground rules for fabrication. However, according to the present invention, by utilizing a dual hard mask approach including a first mask (such as a tetraethoxysilane (TEOS) layer) of a material resistant to a first etch but removable by a second etch, and a second mask (such as a silicon nitride layer) over the first mask, of a material that is resistant to a second etch but removable by a first etch, only one additional DUV photolithographic mask is required to create separate hard masks for gate structures in DRAM arrays, DRAM support, and logic devices. The nitride layer on top of a polysilicon layer over the gate oxide areas in the arrays serves as an etch stop for the subsequent self-aligned contact etch process, thus enabling further cell size reduction in the array area of the embedded DRAM. By patterning gate structure on array devices and logic devices using a nitride/TEOS bilayer hard mask on the array devices and a TEOS layer hard mask on the logic devices allows the formation of borderless contacts in the array area while maintaining tight control of the polysilicon gate dimensions in the logic area.

BRIEF DESCRIPTION OF THE DRAWINGS

For further understanding of the present invention, reference should be made to the following detailed description of the preferred embodiments taken in conjunction with the accompanying drawings in which like elements have been designated with like reference numerals, and wherein.

DETAILED DESCRIPTION OF THE INVENTION

Figure 1:
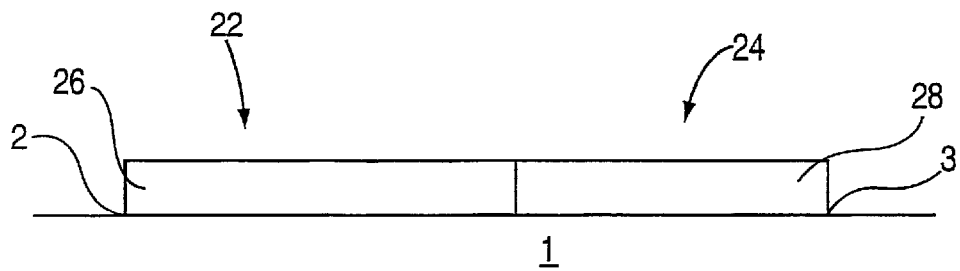
FIGS. 1 through 7 represent schematic cross-sectional views illustrating processing steps according to an embodiment of a preferred method of the present invention.

Referring to FIG. 1, a silicon semiconductor substrate 1 is shown, having a first device area 22 (e.g., memory area or DRAM area) and a second device area 24 (e.g., logic area). First device area 22 includes a thick gate oxide layer 2 disposed upon substrate 1 and covered by a pre-doped or intrinsic polysilicon layer 26. Second device area 24 includes a thin gate oxide layer 3 disposed upon substrate 1 and covered by a polysilicon layer 28, which can be intrinsic or doped with the same dopant concentration as polysilicon layer 26 or differently from polysilicon layer 26. In the example shown, the first device area 22 lies adjacent the second device area 24, both disposed upon a silicon semiconductor substrate 1. It is not necessary that the structures abut one another. In the process disclosed herein, a plurality of gates will be etched from these gate material structures to form the gates of semiconductor devices, such as CMOS transistors or the like. The first device area 22 may typically comprise a doped polysilicon material 26, while the second device area 24 may typically be formed of intrinsic (undoped) polysilicon 28. The actual choice of materials will be dependent upon the device and purpose for which the gates are formed. For example, in dynamic random access memory (DRAM) applications, thick gate oxide gates are commonly used for field effect transistors in memory devices because of high gate voltages associated with access transistors, while thin gate oxides are commonly used for the transistors in the associated logic devices for faster performance.

Figure 2:
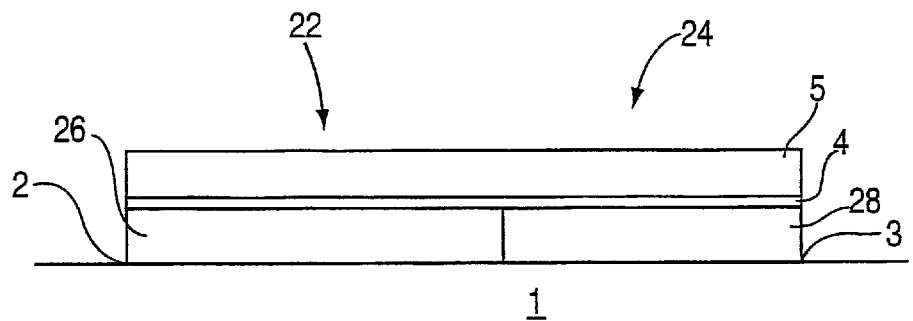

Referring to FIG. 2, there is shown the dual hard mask of the process wherein a silicon oxide material layer, such as of tetraethoxysilane (TEOS) or equivalent, may be deposited as a first hard mask 4 upon the device areas 22 and 24, followed by a second hard mask 5 comprising a silicon nitride material layer or equivalent. By utilizing a duallayer hard mask, polysilicon gates in area 22 may be formed with both masks, while polysilicon gates in area 24 are formed using only the first mask. With this dual mask approach, only one additional photolithographic mask is required to create each of the gates needed for any application. For example, all the gates required for the arrays, support, and logic devices of a DRAM can be fabricated with these two hard masks and one additional DUV mask. Further, as will be seen below, the second mask will serve as an etch stop for the contact etch. Note, also, that the first hard mask will be chosen to be susceptible to a second etching process, yet resistant to a first etching process. Conversely, the second hard mask will be chosen to be susceptible to the first etching process, but resistant to the second etching process. Hence, oxides and nitrides are useful as first and second hard mask materials because of their differing susceptibilities to etching. Note, also, that the oxide and nitride materials disclosed herein may be reversed, that is to say that the first hard mask 4 may be made of a silicon nitride and the second mask 5 made of a silicon oxide, so long as the other oxide and nitride materials disclosed below with respect to subsequent steps are also reversed.

Figure 3:
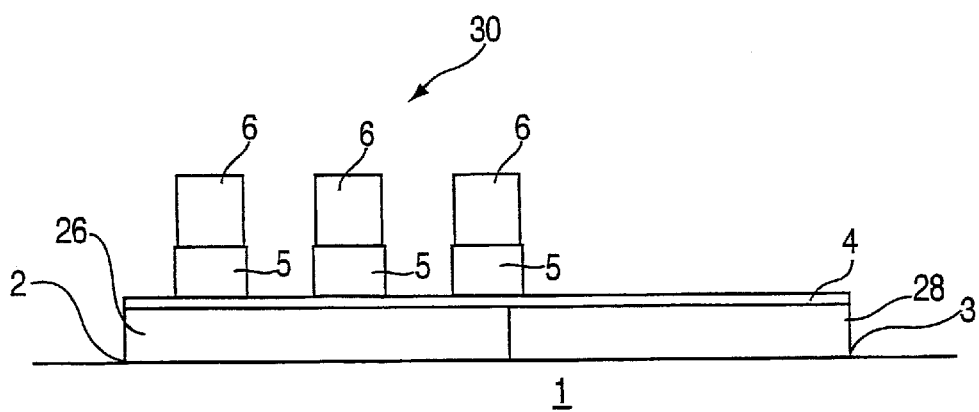

Referring to FIG. 3, a layer of photoresist 6 is patterned using the first DUV lithographic mask upon the second hard mask 5 and the exposed surface is etched with an etching process (the first etch process) that selectively removes and penetrates the second hard mask 5, but substantially stops at the first hard mask 4. The material of the first hard mask 4 is chosen to act as a stop to the etch. The result of the etch is to leave a gate pattern 30 upon the second hard mask 5 in the first device area 22.

Figure 4:
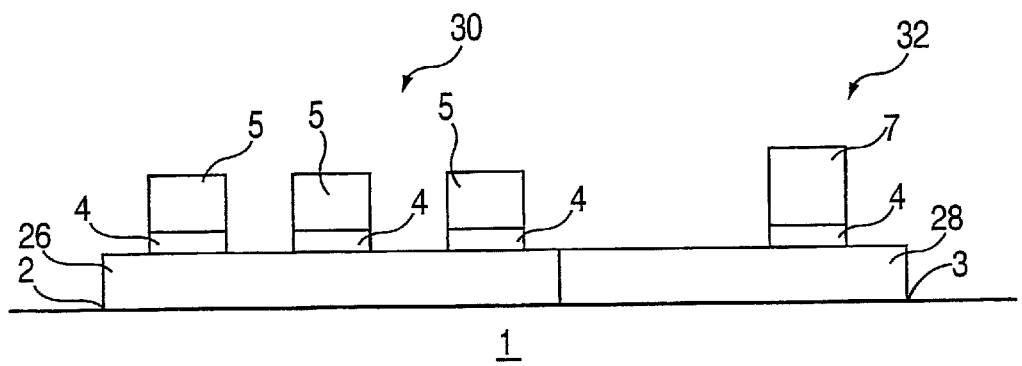

Referring to FIG. 4, a second layer of photoresist 7 is applied and patterned using the second DUV lithographic mask over second device area 24 only. Another etch (the second etch process) is executed upon the first hard mask layer 4 in the first device area 22 using hard mask 5 as an etch mask and in the second device area 24 using photoresist 7 as an etch mask. The result of the second etch is to leave a gate pattern 30 in first device area 22 and a gate pattern 32 in second device area 24 both upon the first hard mask 4. Photoresist layer 7 is then removed.

Figure 5:
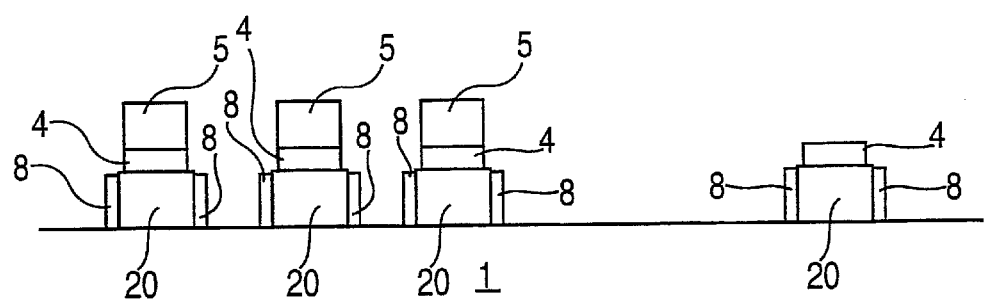

Referring to FIG. 5, an etch is executed to transfer gate pattern 30 through the nitride/TEOS bilayer hard mask and gate patern 32 through the first hard mask 4 to the thick gate oxide device area 22 and the thin gate oxide device area 24, respectively, thereby forming a plurality of individual gates 20. The sidewalls of the gates 20 are oxidized and provided with spacers 8.

Figure 6:
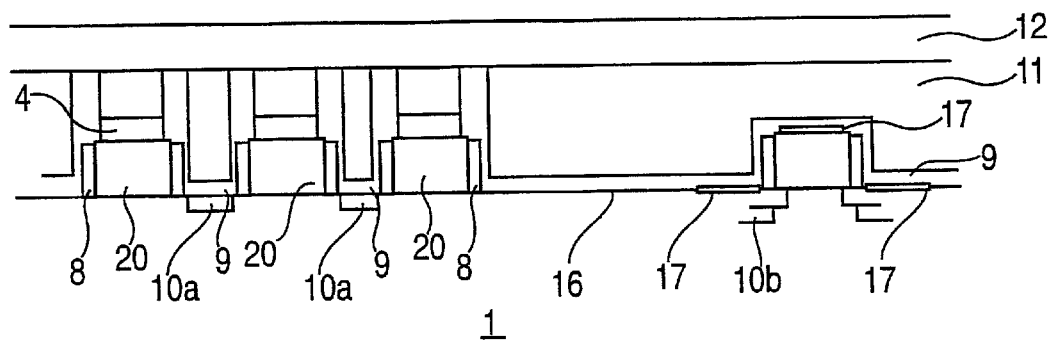

Referring to FIG. 6, the source/drain regions 9 are implanted with dopants to form doped regions 10a and 10b. Dopants will typically be either arsenic, boron, boron difluoride or phosphorous, depending upon the final device desired. A blocking lithography layer, in the nature of a pattern, is laid down to block silicide formation where none is desired. Silicide 17 is then formed on the structures to reduce electrical resistance. Typically, silicide will be avoided where it could short out to a buried strap or cause similar problems. In the drawings, as an example, the silicide 17 is shown being used for the thin gate 24 devices, but not for the thick gate 22 devices. Notice that the blocking lithography may also be used to allow removal of any residual first hard mask material 4 that may be blocking a gate 20 where silicide 17 is desired, as is shown with respect to the thin gate area 24 device. Generally, the silicide 17 will be either a titanium silicide or a cobalt silicide and is typically formed by depositing titanium or cobalt on the desired regions and raising the temperature high enough to cause the titanium or cobalt to bond with the silicon in the substrate.

After doping, and any desired silicide formation, a barrier layer 16 of the second hard mask material is laid down to act as an etch stop, followed by a complete blanketing in an insulator 11, such as borophosphosilicate glass (BPSG) or an equivalent thereof. The insulator layer 11 may also optionally be covered with a protective cover layer 12 of the first hard mask material. If a protective cover layer 12 is opted for, then the first hard mask material will generally be selected to be a silicon oxide rather than a silicon nitride, because a blanket of a silicon nitride would create greater capacitance between devices, particularly in applications where the devices are packed closely together. It may be desirable to polish down the insulator layer 11 before deposition of the cover layer 12.

Figure 7:
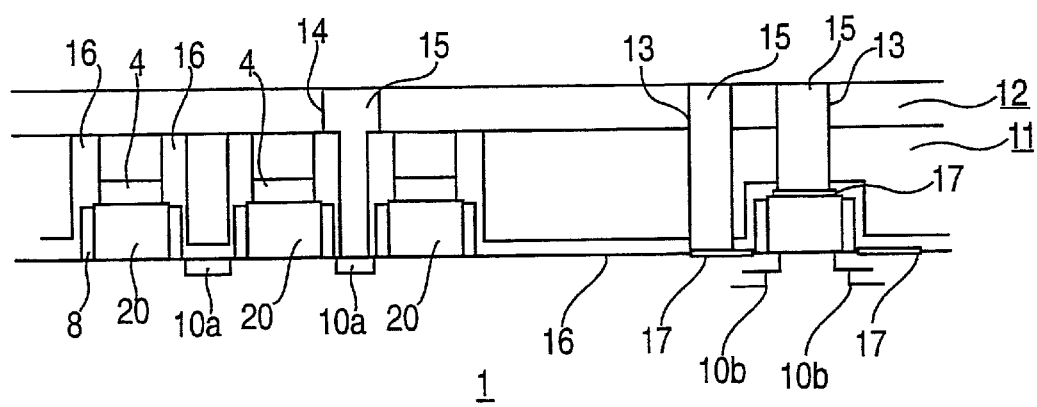

Referring to FIG. 7, bordered 13 and borderless contacts 14 are formed in two separate contact etch operations so as to gain access to the gates 20 in the thin gate oxide device area 24 and source/drains 9 as desired. The etch will typically be a reactive ion etch (RIE) or any other etch process that tends to be directional. Notice how the second hard mask 5, and the barrier layers 16 all act to self-align the RIE process by blocking lateral etching and vertical etching, thereby protecting the gates 20 in the thick gate oxide device area 22 from contacting borderless contacts 14. This allows a high density of device structures. Because of the self-aligning nature of the contact etch, it is possible to make smaller and more detailed structures and devices at greater density.

Conductive materials 15 are then implanted into the contact etch channels 13, 14 to provide electrical communication to the gates 20 and source/drains 9. Typically, such conductors are usually tungsten or doped polysilicon.

While preferred embodiments have been shown and described, various modifications and substitutions may be made thereto without departing from the spirit and scope of the invention. Accordingly, it is to be understood that the present invention has been described by way of illustration only, and such illustrations and embodiments as have been disclosed herein are not to be construed as limiting to the claims.

What is claimed is:

1. A method for fabricating a dual gate structure, comprising:
   providing a semiconductor substrate having a first device area and a second device area covered by a gate oxide layer and a polysilicon layer;
   forming a first hard mask over said polysilicon layer, said first hard mask being a material that is resistant to a first etching, but susceptible to a second etching;
   forming a second hard mask over said first hard mask, said second hard mask being a material that is resistant to said second etching, but susceptible to said first etching;
   patterning and etching said second hard mask with a first etch to form a gate pattern on said first device area, said first hard mask serving as an etch stop for said first etch; and
   patterning and etching said first hard mask with a second etch to transfer gate patterns on said second device area and said first device area.

2. The method of claim 1 comprising removing exposed portions of the polysilicon layer with a third etch to form gate structures on the first device area and the second device area.

3. The method of claim 2 comprising oxidizing and forming spacers on sidewalls of said gate structures.

4. The method of claim 1 wherein the first hard mask comprises a silicon oxide material.

5. The method of claim 4 wherein the first hard mask material comprises TEOS.

6. The method of claim 1 wherein the second hard mask comprises a nitride material.

7. The method of claim 6 wherein the second hard mask material comprises silicon nitride.

8. The method of claim 1 wherein the first device area is a memory device area.

9. The method of claim 1 wherein the second device area is a logic area.

10. A method for fabricating a dual gate structure, comprising;
    providing a semiconductor substrate having a memory device area and a logic device area covered by a gate oxide layer and a polysilicon layer;
    forming a first silicon oxide hard mask over the polysilicon layer, the first hard mask being a material that is resistant to a first etching, but susceptible to a second etching;

forming a second silicon nitride hard mask over the first hard mask and the polysilicon layer, the second hard mask being a material that is resistant to a second etching, but susceptible to a first etching;

patterning and etching said second hard mask with a first etch to form a gate pattern on the memory device area; and patterning and etching said first hard mask with a second etch to transfer gate patterns on the logic device area and the memory device area;

removing exposed portions of the polysilicon layer with a third etch to form gate structures on the memory device area and the logic device area; and, oxidizing and forming spacers on sidewalls of said gate structures.

* * * * *